(12) United States Patent
Abouzeid et al.

(10) Patent No.: US 8,867,264 B2
(45) Date of Patent: Oct. 21, 2014

(54) SRAM READ-WRITE MEMORY CELL HAVING TEN TRANSISTORS

(75) Inventors: Fady Abouzeid, Grenoble (FR); Sylvain Clerc, Chemin du bois d'Artas (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 188 days.

(21) Appl. No.: 13/578,261

(22) PCT Filed: Feb. 14, 2011

(86) PCT No.: PCT/FR2011/050306
§ 371 (c)(1),
(2), (4) Date: Nov. 6, 2012

(87) PCT Pub. No.: WO2011/098743
PCT Pub. Date: Aug. 18, 2011

(65) Prior Publication Data
US 2013/0051131 A1 Feb. 28, 2013

(30) Foreign Application Priority Data
Feb. 15, 2010 (FR) ...................................... 10 51043

(51) Int. Cl.
*G11C 11/00* (2006.01)

(52) U.S. Cl.
USPC ..................... 365/156; 365/49.1; 365/189.04; 365/230.05

(58) Field of Classification Search
CPC ........ G11C 11/413; G11C 7/065; G11C 7/12; G11C 11/412; G11C 11/419; G11C 2207/063; G11C 8/16; G11C 13/003; G11C 11/418; G11C 7/1045
USPC .............. 365/154, 156, 189.04, 230.05, 49.1, 365/49.11, 49.15, 49.16
See application file for complete search history.

(56) References Cited

U.S. PATENT DOCUMENTS

| | | | |
|---|---|---|---|
| 5,828,597 A | 10/1998 | Madan | |
| 7,483,332 B2 * | 1/2009 | Houston | ................... 365/230.05 |
| 2008/0062756 A1 * | 3/2008 | Mayor et al. | ................... 365/181 |
| 2009/0147560 A1 | 6/2009 | Joshi et al. | |

OTHER PUBLICATIONS

International Search Report and Written Opinion dated May 11, 2011 from corresponding International Application No. PCT/FR2011/50306.

English translation of the International Preliminary Examination dated May 11, 2011 from corresponding International Application No. PCT/FR2011/50306.

* cited by examiner

*Primary Examiner* — Hien Nguyen
(74) *Attorney, Agent, or Firm* — Wolf, Greenfield & Sacks, P.C.

(57) ABSTRACT

A device and a method for controlling an SRAM-type device, including: a bistable circuit and two switching circuits respectively connecting two access terminals of the bistable circuit to two complementary bit lines in a first direction, each switching circuit including a first switch and a second switch in series between one of the bit lines and one of the access terminals, the control terminal of the second switch being connected to a word control line in the first direction; and a third switch between the midpoint of the series connection and a terminal of application of a reference potential, a control terminal of the third switch being connected to the other one of the access terminals.

10 Claims, 3 Drawing Sheets

SRAM READ-WRITE MEMORY CELL HAVING TEN TRANSISTORS

CROSS REFERENCE TO RELATED APPLICATIONS

This application is a U.S. National Stage patent application based on International patent application number PCT/FR2011/50306, filed on Feb. 14, 2011, which application claims the priority benefit of French patent application number 10/51043, filed on Feb. 15, 2010, which applications are hereby incorporated by reference to the maximum extent allowable by law.

BACKGROUND

1. Technical Field

The present disclosure generally relates to random access memories of SRAM type (Static Random Access Memory) in an integrated circuit.

The disclosure further relates to such memories, be they self-contained or embedded in an electronic circuit comprising other functions such as, for example, a microcontroller.

2. Discussion of the Related Art

Generally, an SRAM cell is based on the use of bistable circuits in CMOS technology. Several cells are arranged in an array by being connected to bit lines and word lines.

Most of the time, the cells comprise six transistors. The bistable circuit is generally comprised of four transistors, and two access transistors connect this bistable circuit to the bit lines while being controlled by a word line.

More recently, it has been attempted to lower the power supply voltage by providing a cell operating under a lower power supply voltage than the levels commonly used for the technology in which the cells are manufactured.

An example of such a cell is described in article "A 32 kb 10 T Sub-threshold SRAM Array with Bit-Interleaving and Differential Read Scheme in 90 nm CMOS", by Roy K. et al., published in Solid-State Circuits Conference, Digest of Technical Papers. IEEE International, pp. 388-622, Feb. 3-7, 2008. This cell comprises ten transistors and a stage for switching between the bistable circuit and each transistor of access to the bit line, each of the switching stages comprising a first additional access transistor between the bistable circuit and each access transistor, and a second additional transistor between the access transistor and a potential variable according to the read or write operation. The additional access transistor is controlled by an additional signal. The variable potential is provided by a circuit in a transistor technology which results in limiting the cell operation to the sole low voltages.

A disadvantage of the different known SRAMs is that the content of the bistable circuit is altered in read mode.

Document US-A-2010/0142258 describes another SRAM cell with ten transistors.

FIG. 1 shows a cell with ten transistors such as shown in FIG. 3 of this document. A bistable circuit is based on the principle of two cross-coupled inverters. A first inverter is formed of two transistors in series 2 (M2) and 1 (M1) between potentials VDD and VSS. A second inverter is formed of two transistors in series 3 (M3) and 4 (M4) between potentials VDD and VSS. The control gates of transistors 1 and 2 are connected to the interconnection (node V2) of transistors 3 and 4. The control gates of transistors 3 and 4 are connected to the interconnection (node V1) of transistors 1 and 2. Nodes V1 and V2 are connected to bit lines BL and BLB by series connections of two transistors, respectively 5 (M5) and 8 (ML2), and 6 and 10 (MR2). The contacts common to transistors 5 and 8 are connected to a line GNDX by a transistor 7 (ML1). The contacts common to transistors 6 and 10 are connected to line GNDX by a transistor 9 (MR1). Line GNDX is grounded by a transistor MSLEEP. The gates of transistors 5 and 6 are connected to a word write line WWL and the gates of transistors 8 and 10 are connected to a word read line RWWL. The bodies of transistors 5, 6, 8, and 10 are directly grounded. Once arranged in an array, bit lines BL and BLB are in the vertical direction and lines WWL and RWWL are in the horizontal direction.

At the cell level, this structure seems to solve the issue of the prior cell. However, in an array architecture, unaddressed cells are disturbed when the word read line and the word write line are activated at the same time, which limits multiplexing possibilities. This limitation will be developed hereafter. Further, it would be desirable to improve the low power supply voltage operation.

SUMMARY

An embodiment provides a RAM cell with ten transistors overcoming all or part of the disadvantages of known circuits.

An embodiment provides a solution decreasing cell leakages during a read operation.

An embodiment provides a cell which is particularly well adapted to a low power supply voltage.

An embodiment provides a SRAM-type device, comprising:

a bistable circuit; and two switching circuits respectively connecting two access terminals of the bistable circuit to two complementary bit lines in a first direction, each switching circuit comprising:

a first switch and a second switch in series between one of the bit lines and one of said access terminals, the control terminal of the second switch being connected to a word control line in the first direction; and a third switch between the midpoint of said series connection and a terminal of application of a reference potential, a control terminal of the third switch being connected to the other one of said access terminals.

According to an embodiment, the control terminal of the first switch in series is connected to a word line in a second direction.

According to an embodiment, the bistable circuit is comprised of a first inverter formed of a first MOS transistor of a first channel type and of a first MOS transistor of a second channel type, and of a second inverter formed of a second MOS transistor of a first channel type and of a second MOS transistor of a second channel type.

According to an embodiment, the transistor bodies are connected to potentials (VP, VN) different from the power supply potentials of the bistable circuit (12).

According to an embodiment, the transistors and switches are of CMOS type.

According to an embodiment, said reference potential is fixed.

According to an embodiment, said reference potential is a variable potential.

An embodiment also provides a RAM comprising an array of devices.

An embodiment also provides a method for controlling a memory device wherein, whatever the operating phase, one of the third switches is on and the other one is off.

An embodiment also provides a method according to which:

for a write operation: the first and second switches are on, one of the third switches being on and the other one off;

for a read operation: the first switches are on, the second switches are off, one of the third switches being on and the other one off; and in a state holding phase, the first and second switches are off, one of the third switches being on and the other one off.

BRIEF DESCRIPTION OF THE DRAWINGS

The foregoing and other objects, features, and advantages will be discussed in detail in the following non-limiting description of specific embodiments in connection with the accompanying drawings, among which.

DETAILED DESCRIPTION

Figure 1:
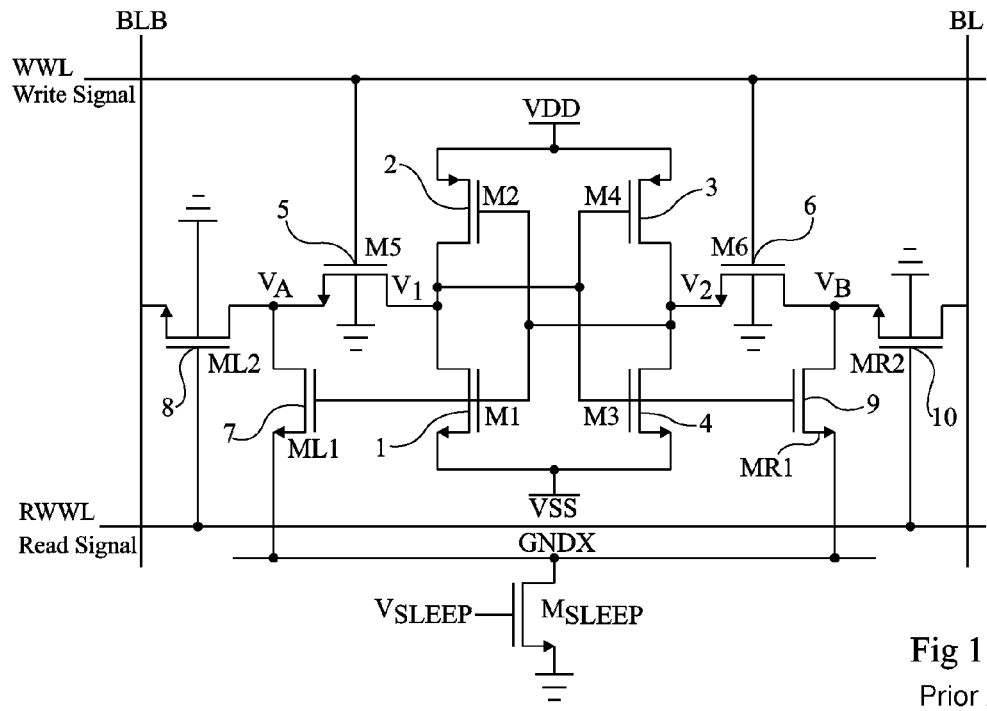
FIG. 1, previously described, shows the diagram of a known cell with ten transistors.

The same elements have been designated with the same reference numerals in the different drawings which have been drawn out of scale. For clarity, only those steps and elements which are useful to the understanding of the embodiments have been shown and will be described.

Embodiments will be described in relation with transistors in CMOS technology. Embodiments may, however, be applied to any other transistor technology or to a combination of different technologies.

Figure 2:
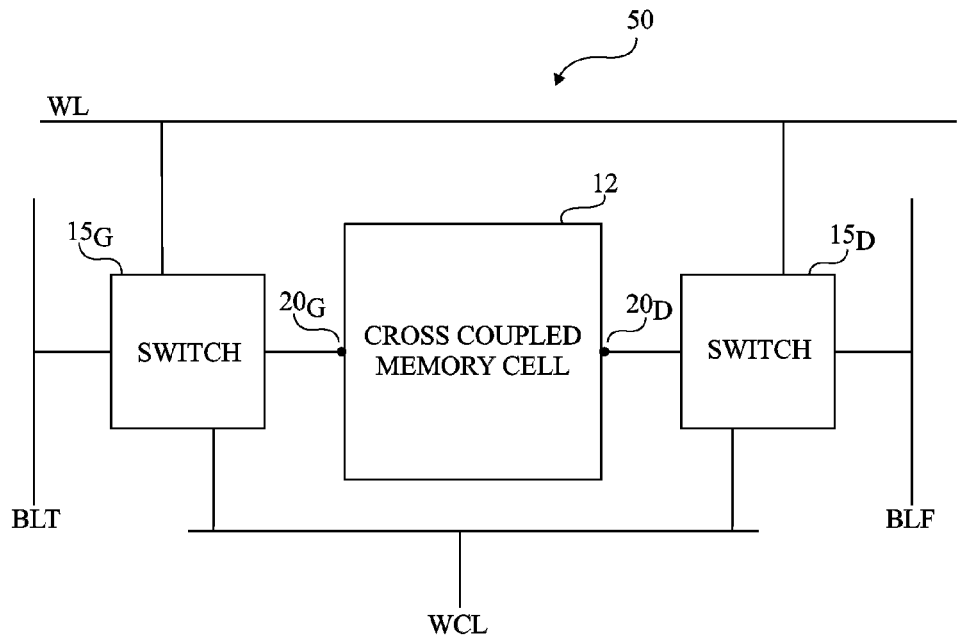
FIG. 2 very schematically shows in the form of blocks an example of a SRAM cell based on the use of bistable circuits in CMOS technology.

FIG. 2 shows in the form of blocks an SRAM cell 50 comprising:

a pair of complementary bit lines BLT and BLF;

a word line WL;

a line for controlling words in a column WCL;

a bistable circuit 12 (CROSS COUPLED MEMORY CELL) intended to store binary data and comprising first $20_G$ and second $20_D$ complementary read and write access terminals; and two switching circuits $15_G$, $15_D$ (SWITCH) respectively connecting the two access terminals of bistable circuit $20_G$, $20_D$ to the two complementary bit lines. Circuits 15 enable to selectively access the bistable circuit according to the write or read operation to be performed.

Cells 50 described in FIG. 2 are arranged in an array with additional functions such as address decoding or amplification functions to form an SRAM. As will better appear hereafter from the description of FIG. 5, the bit lines are in a first direction (arbitrarily vertical in the orientation of the drawings), word line WL is in a second direction (arbitrarily horizontal in the orientation of the drawings) preferably perpendicular to the first one, and word line WCL is in the first direction.

Figure 3:
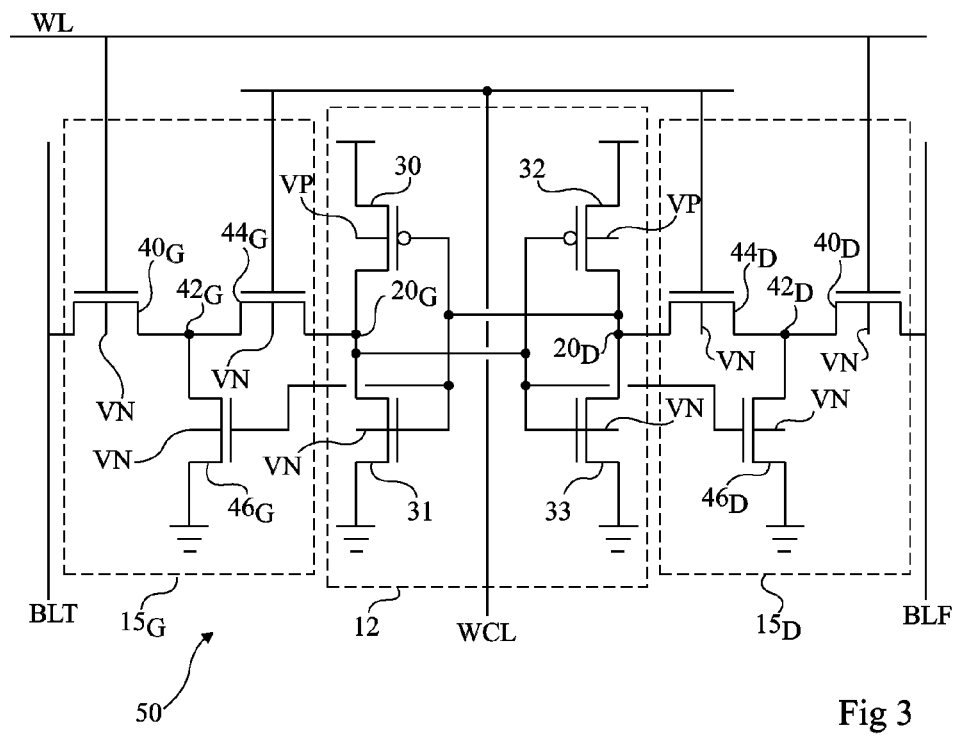
FIG. 3 shows a detailed electric diagram of a SRAM cell.

FIG. 3 is a more detailed representation of an embodiment of an SRAM cell 50. Usually, bistable circuit 12 is based on the principle of two cross-coupled inverters. An inverter arbitrarily called a left-hand inverter is comprised of two transistors: a PMOS transistor 30 and an NMOS transistor 31, the control gates of these two transistors being common, and connected to access terminal $20_D$. An inverter arbitrarily called a right-hand inverter is comprised of a PMOS transistor 32 and of an NMOS transistor 33, the control gates of these two transistors being common, and connected to access terminal $20_G$.

The bodies of the N-channel transistors are preferably connected to a potential VN ranging between 0 and 50% of voltage Vdd. The bodies of the P-channel transistors are connected to a potential VP ranging between 50% of voltage Vdd and this voltage Vdd. Selecting potentials respectively different from 0 and from Vdd enables to set threshold voltage VT of the MOS transistors to lower values, and thus improves the low power supply voltage operation.

Data formed of two complementary logic values 1, 0 or 0, 1 are stored on the two output nodes $20_G$ and $20_D$ of the inverters.

According to the described embodiment, each switching block 15 ($15_G$, $15_D$) comprises three switches, preferably three transistors:

a first access transistor 40 ($40_G$, $40_D$) connected between one of the lines of the pair of bit lines BLT, BLF and an intermediary node 42 ($42_G$, $42_D$), the control gate of transistor 40 being connected to word line WL;

a second access transistor 44 ($44_G$, $44_D$) connected between node 42 ($42_G$, $42_D$) and one of terminals 20 ($20_G$, $20_D$) of the bistable circuit, the control gate of transistor 44 being connected to the word column line WCL; and a transistor 46 ($46_G$, $46_D$) for pulling down the value of node 42, connected between node 42 and a terminal of application of a reference voltage, the gate or control terminal of transistor 46 being connected to the common gate of the opposite inverter of the bistable circuit (node $20_D$ for $46_G$ and node $20_G$ for $46_D$). In the embodiment of FIG. 2, the reference potential is fixed and is the ground.

Figure 4A:
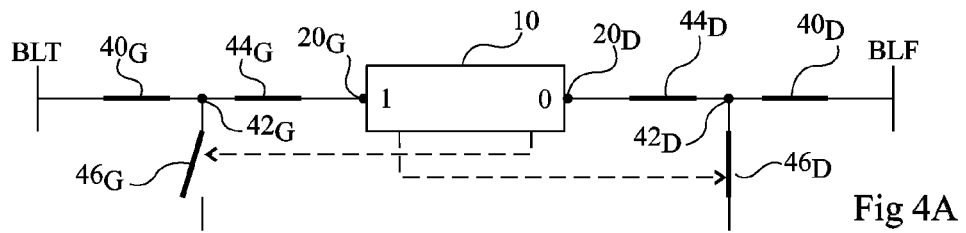
FIGS. 4A to 4E show in the form of switches the state of the transistors of a RAM cell in write, data hold, and read operations according to an embodiment.
Figure 4B:
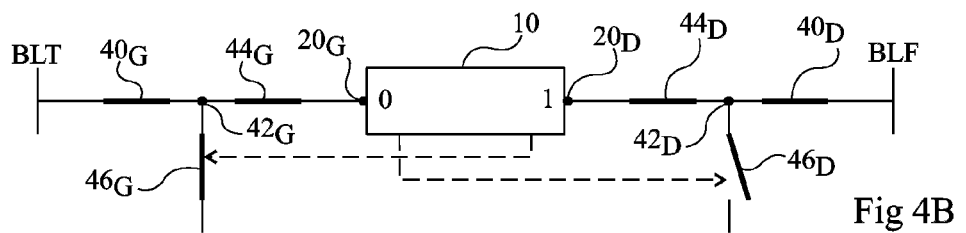

FIGS. 4A and 4B describe write operations in cell 50.

To write data into bistable circuit 12, the two bit lines BLT and BLF are first precharged to a high voltage (Vdd). The four transistors $40_G$, $40_D$, $44_G$, $44_D$ are then turned on, by maintaining at voltage Vdd the word line and the write word line not visible in FIGS. 4A and 4B.

FIG. 4A illustrates the writing of a state 1 into node $20_G$ and of a state 0 into node $20_D$. Bit line BLF is pulled to ground and bit line BLT is maintained at voltage Vdd. Since transistors $40_D$ and $44_D$ are on, the low voltage of line BLF is transferred onto the control gate of transistor $46_G$ and turns it off. Voltage Vdd of line BLT is then transferred onto node $20_G$, setting it to the high state. The high voltage of line BLT is transferred onto the control gate of transistor $46_D$ and turns it on, pulling node $42_D$ to ground. Node $20_D$ is then set to the low state.

FIG. 4B illustrates the writing of a state 0 into node $20_G$ and of a state 1 into node $20_D$. Bit line BLF is maintained at voltage Vdd and bit line BLT is pulled to ground. Since transistors $40_G$ and $44_G$ are on, the low voltage of BLT is transferred onto the control gate of transistor $46_D$ and turns it off. The high voltage of BLF is then transferred onto node $20_D$, setting it to the high state. The high voltage of BLF is transferred onto the control gate of transistor $46_G$ and turns it on, pulling node $42_G$ to ground. Node $20_G$ is then set to the low state.

Figure 4C:
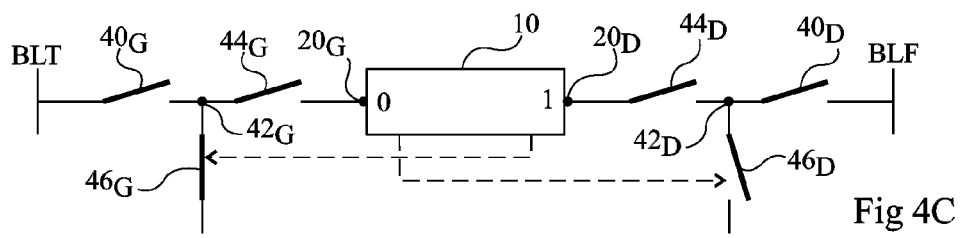

FIG. 4C describes the biasings applied to a SRAM cell according to an embodiment to keep (hold mode) the data written into cell 50.

To keep data in bistable circuit 12, the two bit lines BLT and BLF are pulled to Vdd. The four transistors $40_G$, $40_D$, $44_G$, $44_D$ are then turned off, while maintaining the word line and the write word line, not visible in FIG. 3C, at ground. This configuration enables avoiding current leakages from the bistable circuit to the bit lines through the four access transistors.

FIG. 4C illustrates the holding of a state 0 in node $20_G$ and of a state 1 in node $20_D$. State 0 of node $20_G$ is transferred onto the control gate of transistor $46_D$ and turns it off, state 1 of node $20_D$ is transferred onto the control gate of transistor $46_G$ and turns it on, with no effect upon the biasing of the output nodes.

Symmetrically, if a state 1 is kept in node $20_G$ and a state 0 is kept in node $20_D$, state 1 turns on transistor $46_D$ and state 0 turns off transistor $46_G$, without changing the biasing of the output nodes.

Figure 4D:
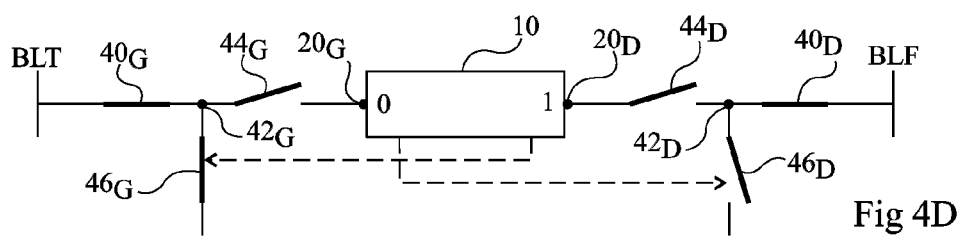
Figure 4E:
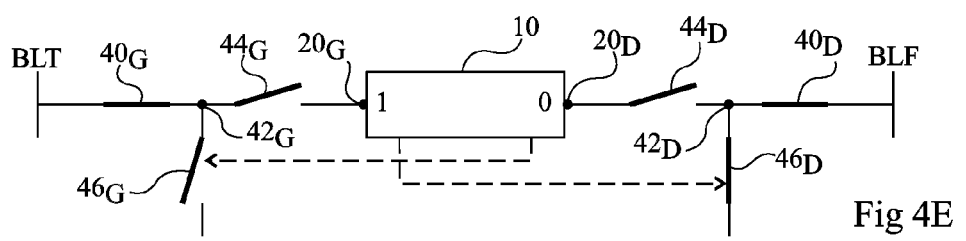

FIGS. 4D and 4E describe an embodiment of read operations in cell 50.

To read a piece of data from bistable circuit 12, the two bit lines BLT and BLF are first precharged to voltage Vdd. The two transistors $40_G$ and $40_D$ are then turned on by maintaining the word line, not visible in FIGS. 4D and 4E, at voltage Vdd. Both transistors $44_G$, $44_D$ are turned off by pulling to ground the write word line, not visible in FIGS. 4D and 4E. This configuration enables isolating the bistable circuit and to decrease current leakages through the access transistors, and to decrease the read disturbance introduced by bit lines BLT/BLF on the bistable node storing state 0 (node $20_G$ in FIG. 4D, node $20_D$ in FIG. 4E).

FIG. 4D illustrates the reading of a state 0 from node $20_G$ and of a state 1 from node $20_D$. The bit lines are disconnected from Vdd to stop the precharge. Logic value 0 propagates from output node $20_G$ to the control gate of transistor $46_D$ and turns off this transistor. The voltage value of line BLF is thus not modified. State 1 propagates from output node $20_D$ to the control gate of transistor $46_G$ and turns on this transistor, pulling to ground node $42_G$ and the voltage value of bit line BLT. The complementary state of the two transistors 46 causes a current difference between two bit lines, with no direct connection with the output nodes. This current difference between the two bit lines is conventionally amplified in a current or voltage amplifier, located at the bottom of the column of the memory plane and containing the cell and the data thus read.

FIG. 4E illustrates the reading of a state 1 from node $20_G$ and of a state 0 from node $20_D$. The bit lines are disconnected from voltage Vdd to stop the precharge. State 1 propagates from output node $20_G$ to the control gate of $46_D$ and turns on this transistor. The voltage of line BLF is thus pulled to ground. State 0 propagates from output node $20_D$ to the control gate of transistor $46_G$ and turns off this transistor, without modifying the voltage of bit line BLT. As previously, the current difference between the two bit lines is amplified to then read the data, with no direct connection with the output nodes.

The memory cell described in the above embodiment has the following advantages:

it operates with a low power supply voltage with respect to the levels commonly used for the technology in which the cells are manufactured;

series-connected access transistors 40 and 44 limit current leakages; and the reading is performed through pull-down transistors 46 ($46_G$, $46_D$) with no discharge of the bistable, thus protecting the stored data.

The operation with a low power supply voltage is more specifically obtained by connecting the transistor bodies to potentials different from Vdd and from the ground. This decreases threshold voltage VT of the transistors and, for a given power supply voltage, enables to have a larger current Ion.

Figure 5:
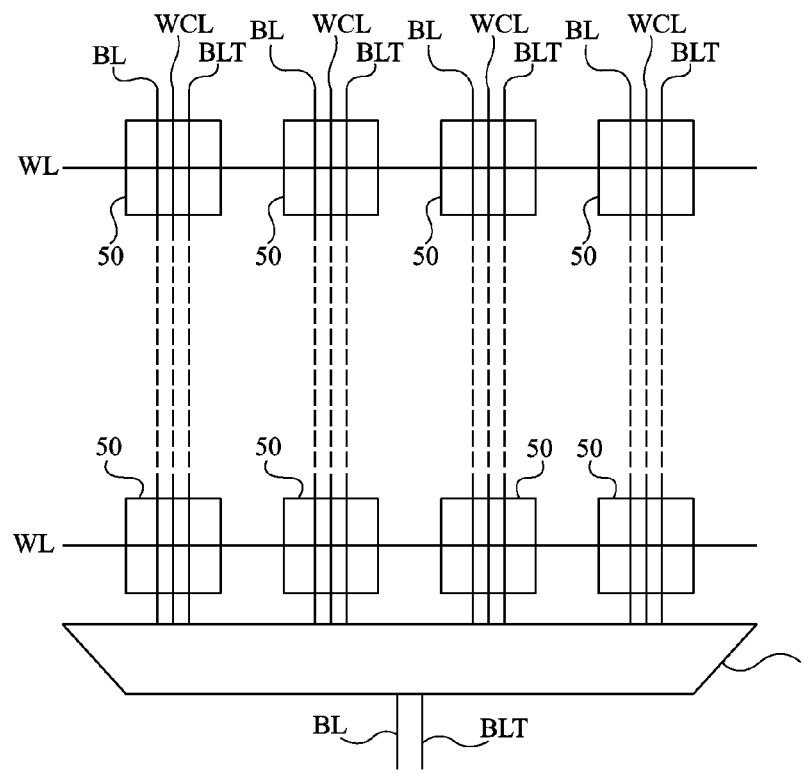
FIG. 5 very schematically illustrates an example of architecture using memory cells of FIG. 3.

FIG. 5 schematically shows an example of an array connection of memory cells 50 such as described hereabove.

Cells 50 are arranged in lines and in columns. Each line comprises a word line WL common to the line cells. Each column comprises two bit lines BL and BLT and one word line WCL common to the column cells. For each group of columns (for example, of four columns), a multiplexer 35 of the column conductors is provided. This multiplexer enables sharing the same amplifier (not shown). The fact of providing line WCL in a column rather than in a line avoids, on writing into a cell, that the three other cells in the line undergo a parasitic reading. It is thus avoided to alter the content of these cells.

Another advantage of the described embodiment is that it is compatible with a variation of the reference voltage, at the cost of an increase in the memory surface area to generate the intermediary voltage between voltage Vdd and the ground.

Another advantage of the described embodiment is that the control gates of the pull-down transistors are connected to the common gates of the opposite inverters. In particular, this enables to perform an indirect reading without intervening on the output nodes of the bistable.

Specific embodiments have been described. Different variations and modifications will occur to those skilled in the art. In particular, although embodiments have been described in relation with an example of a cell where the transistors connected to the high voltage have a P channel, those connected to the low voltage have an N channel, and the switches of the switching circuits have an N channel, the channel type of all or part of the transistors may be inverted, provided to adapt the control signals.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An SRAM-type device, comprising:
   a bistable circuit; and
   two switching circuits respectively connecting two access terminals of the bistable circuit to two complementary bit lines in a first direction, each switching circuit comprising:
   a first switch and a second switch in series between one of the bit lines and one of said access terminals, the control terminal of the second switch being connected to a word control line in the first direction;
   a third switch between the midpoint of said series connection and a terminal of application of a reference potential, a control terminal of the third switch being connected to the other one of said access terminals.

2. The device of claim 1, wherein the control terminal of the first switch in series is connected to a word line in a second direction.

3. The device of claim 1, wherein the bistable circuit is comprised of a first inverter formed of a first MOS transistor of a first channel type and of a first MOS transistor of a second channel type, and of a second inverter formed of a second MOS transistor of a first channel type and of a second MOS transistor of a second channel type.

4. The device of claim 3, wherein the transistor bodies are connected to potentials different from the power supply potentials of the bistable.

5. The device of claim 1, wherein the transistors and switches are of CMOS type.

6. The device of claim 1, wherein said reference potential is fixed.

7. The device of claim 1, wherein said reference potential is a variable potential.

8. A RAM comprising an array of devices of claim 1.

9. A method for controlling the memory device of claim 1, wherein, whatever the operating phase, one of the third switches is on and the other one is off.

10. The method of claim 9, wherein:
- for a write operation: the first and second switches are on, one of the third switches being on and the other one off;
- for a read operation: the first switches are on, the second switches are off, one of the third switches being on and the other one off; and
- in a state holding phase, the first and second switches are off, one of the third switches being on and the other one off.

* * * * *